United States Patent
Obradovic et al.

(10) Patent No.: US 7,892,930 B2
(45) Date of Patent: Feb. 22, 2011

(54) METHOD TO IMPROVE TRANSISTOR TOX USING SI RECESSING WITH NO ADDITIONAL MASKING STEPS

(75) Inventors: Borna Obradovic, McKinney, TX (US); Shashank S. Ekbote, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 25 days.

(21) Appl. No.: 11/868,787

(22) Filed: Oct. 8, 2007

(65) Prior Publication Data

US 2009/0093095 A1 Apr. 9, 2009

(51) Int. Cl.
H01L 21/336 (2006.01)
(52) U.S. Cl. .............. 438/299; 257/E21.409; 257/E21.632
(58) Field of Classification Search .......... 438/299, 438/305, 303, 197, 231, 301, 302, 306, 243, 438/552, 438; 257/E21.409, 287, 107, 341, 257/E21.632
See application file for complete search history.

(56) References Cited

U.S. PATENT DOCUMENTS

| | | | |
|---|---|---|---|
| 6,037,230 A * | 3/2000 | Holloway | 438/289 |
| 6,440,791 B1 * | 8/2002 | Gau | 438/239 |
| 2005/0164458 A1 * | 7/2005 | Honeycutt | 438/299 |
| 2006/0024898 A1 * | 2/2006 | Chidambaram et al. | 438/303 |
| 2006/0073665 A1 * | 4/2006 | Jain | 438/303 |
| 2007/0020839 A1 * | 1/2007 | Sridhar et al. | 438/199 |
| 2007/0032028 A1 * | 2/2007 | Zhu et al. | 438/303 |
| 2007/0059907 A1 * | 3/2007 | Hierlemann | 438/527 |
| 2007/0066024 A1 * | 3/2007 | Chakravarthi et al. | 438/301 |

OTHER PUBLICATIONS

Lee et al., "Improved NiSi Salicide Process Using . . . ", 2000, IEEE Electron Device Latters, vol. 21, No. 12, pp. 566-568.*

* cited by examiner

Primary Examiner—Thomas L Dickey
Assistant Examiner—Nikolay Yushin
(74) Attorney, Agent, or Firm—Jacqueline J. Garner; Wade J. Brady, III; Frederick J. Telecky, Jr.

(57) ABSTRACT

A method of forming a transistor device is provided wherein a gate structure is formed over a semiconductor body of a first conductivity type. The gate structure is formed comprising a protective cap thereover and defining source/drain regions laterally adjacent thereto. A first implant is performed of a second conductivity type into both the gate structure and the source/drain regions. The semiconductor body is etched to form recesses substantially aligned to the gate structure wherein the first implant is removed from the source/drain regions. Source/drain regions are implanted or grown by a selective epitaxial growth.

10 Claims, 11 Drawing Sheets

100 # METHOD TO IMPROVE TRANSISTOR TOX USING SI RECESSING WITH NO ADDITIONAL MASKING STEPS

FIELD OF THE INVENTION

The present invention relates to various methods for the manufacture of transistor devices to improve poly depletion and oxide thickness.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFETs), wherein a gate electrode is energized to create an electric field in a channel region of a semiconductor body, by which electrons are allowed to travel through the channel between a source region and a drain region of the semiconductor body. The source and drain regions are typically formed by adding dopants to targeted regions on either side of the channel. A gate dielectric or gate oxide is formed over the channel, and a gate electrode or gate contact is formed over the gate dielectric. The gate dielectric and gate electrode layers are then patterned to form a gate structure overlying the channel region of the substrate.

Conventionally, upon patterning a polysilicon gate electrode, the doping of the polysilicon is performed concurrently with the formation of the source/drains on opposing sides of the gate electrode in the semiconductor body. Typically, heavy doping at this stage is desirable in order to avoid poly depletion and thus keep oxide thickness (Tox) as small as possible. However, too much doping in the source/drain regions can lead to overrun of the extension regions, and lead undesirably to punchthrough and/or leakage.

The necessity to control Short Channel Effects (SCE) requires the complete suppression of dopant diffusion in order to control the lateral and vertical depth and the abruptness of the junction profile. It is known that junctions formed by Solid Phase Epitaxial Regrowth (SPER) of a doped amorphous region allow for meta-stable high activation level and perfectly abrupt profiles. The excellent abruptness of SPER junction results from a poor activation level in the crystalline Si below the amorphous region. Despite the excellent vertical junction profile, several integration issues rise from the lateral amorphisation and from the End of Range (EOR) defects. A strong dependence is often observed of the lateral amorphous region profile near the gate on the implantations used in the prior art. Unless optimized this leads to poor doping active concentration under the gate that significantly increases the overlap resistance. Through a SPER extension process, species combinations of Ge, BF2 and B for PMOS, and As for NMOS have been characterized for transistor performance. Under the correct conditions, the transistor performance can be recovered. An optimised SPER junction can preserve the oxide integrity and avoid the degradation of the poly.

Accordingly, there is a need for improved transistor fabrication methods for processing by which the benefits of decoupling the conventional tradeoff between oxide integrity and degradation of the poly can be achieved while avoiding or mitigating the problems encountered in conventional techniques.

SUMMARY OF THE INVENTION

The following presents a simplified summary in order to provide a basic understanding of one or more aspects of the disclosure. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

In accordance with one aspect of the disclosure, a method of forming a transistor device is provided wherein a gate structure is formed over a semiconductor body of a first conductivity type. The gate structure is formed comprising a protective cap thereover and defining source/drain regions laterally adjacent thereto. A first implant is performed of a second conductivity type into both the gate structure and the source/drain regions. In one example, the semiconductor body is etched to form recesses substantially aligned to the gate structure wherein the first implant is substantially removed from the source/drain regions. In another example, the semiconductor body is etched to form recesses substantially aligned to the gate structure wherein the first implant is entirely removed from the source/drain regions. In one example, such recesses are formed immediately after gate patterning or after formation of offset spacers (used for extension region implants) on lateral edges of the gate. The protective cap is removed and a second implant of a second conductivity type is performed into the source/drain regions and the gate structure.

In another aspect of the disclosure, a method of forming a transistor device is provided wherein a gate structure is formed over a semiconductor body of a first conductivity type. The gate structure is formed comprising a protective cap thereover and defining source/drain regions laterally adjacent thereto. A source/drain implant of a second conductivity type is then performed into both the gate structure and source/drain regions. In one example, the semiconductor body is etched to form recesses substantially aligned to the gate structure wherein the first source/drain implant is substantially removed therefrom. In another example, the semiconductor body is etched to form recesses substantially aligned to the gate structure wherein the first implant is entirely removed from the source/drain regions. In one example, such recesses are formed immediately after gate patterning or after formation of offset spacers (used for extension region implants) on lateral edges of the gate. The recesses are then filled with silicon germanium via a selective epitaxial deposition process. The silicon germanium material has a different lattice spacing than the silicon channel, thereby imparting a compressive strain to the channel region under the gate.

In one example, the silicon germanium material is doped with boron in-situ for the formation of p-type extension regions. In another example, an extension region implant is performed into the silicon germanium material after the selective epi deposition, followed by the formation of sidewall spacers and source/drain implants. Having the boron doped silicon germanium material (either doped in-situ or via implantation) close to the gate as opposed to laterally spaced away (e.g., at the source/drain locations) advantageously allows less germanium to be employed in the recesses for a given desired stress, thereby reducing threading dislocation defects.

In yet another embodiment, the disclosure is directed to a method of forming an NMOS and a PMOS transistor concurrently, comprising forming a gate structure with a protective cap over a semiconductor body in an NMOS region and a PMOS region, respectively. In addition, the method comprises performing an implant of n-type source and drain regions into the NMOS region, p-type source and drain regions into the PMOS region of the semiconductor body, and implanting into the gate structure. Etching into the semiconductor body is performed in both the NMOS and PMOS regions to form recesses substantially aligned to the gate structure wherein the n-type source and drain regions in the NMOS region and p-type source and drain regions in the PMOS region are substantially removed therefrom. Another example comprises etching into the semiconductor body in both the NMOS and PMOS regions to form recesses substantially aligned to the gate structure wherein the n-type source and drain regions in the NMOS region and p-type source and drain regions in the PMOS region are entirely removed therefrom. In one example, such recesses are formed immediately after gate patterning or after formation of offset spacers (used for extension region implants) on lateral edges of the gate. The recesses are then filled with silicon germanium via a selective epitaxial deposition process. The silicon germanium material has a different lattice spacing than the silicon channel, thereby imparting a compressive strain to the channel region under the gate.

In one example, the silicon germanium material is doped with boron in-situ for the formation of p-type extension regions. In another example, an extension region implant is performed into the silicon germanium material after the selective epi deposition, followed by the formation of sidewall spacers and source/drain implants. Having the boron doped silicon germanium material (either doped in-situ or via implantation) close to the gate as opposed to laterally spaced away (e.g., at the source/drain locations) advantageously allows less germanium to be employed in the recesses for a given desired stress, thereby reducing threading dislocation defects.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
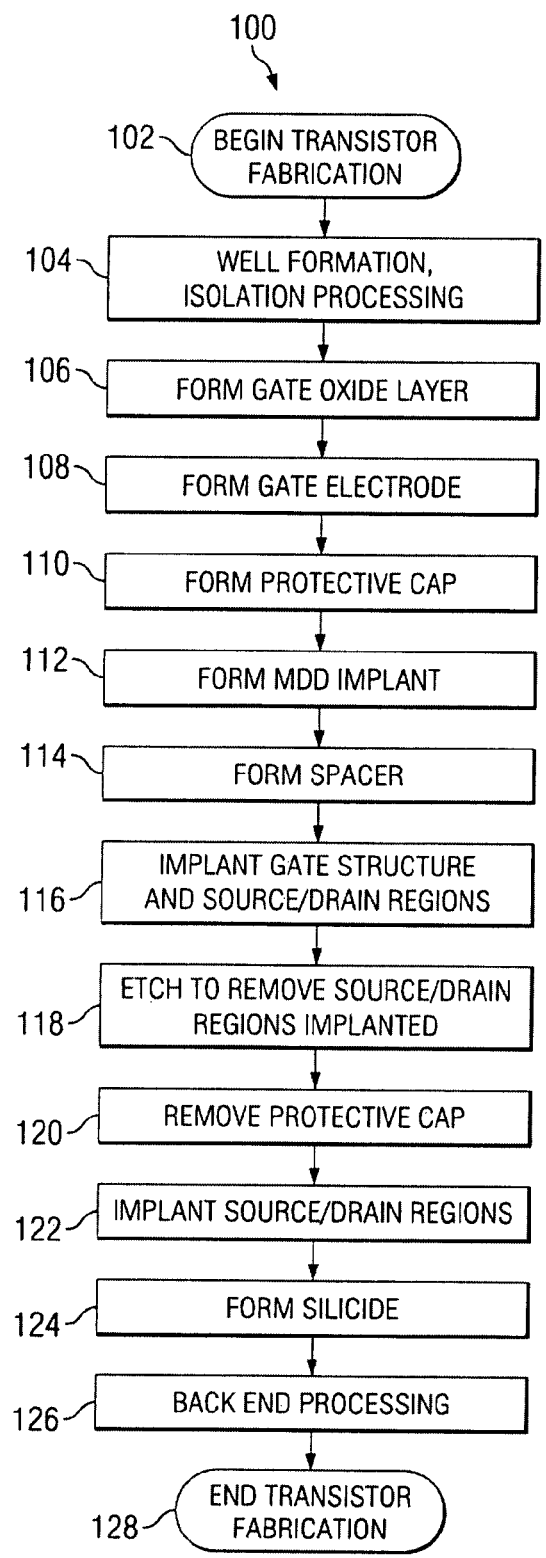
FIG. 1 is a flow chart illustrating a method of forming a transistor having improved Tox according to one aspect of the present invention.

One or more implementations of the present invention will now be described with reference to the attached drawings, wherein like reference numerals are used to refer to like elements throughout, and wherein the illustrated structures are not necessarily drawn to scale. The invention provides transistor structures and methods in which transistor mobility is improved while minimizing defects heretofore associated with conventional strained silicon device solutions.

Referring now to FIGS. 1 and 2A-2J, further aspects of the invention relate to methods of fabricating integrated circuits, wherein FIG. 1 illustrates an exemplary method 100 in accordance with the invention, and FIGS. 2A-2J illustrate the exemplary transistor device at various stages of fabrication in accordance with the invention. While the exemplary method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of ICs and composite transistors illustrated and described herein, as well as in association with other transistors and structures not illustrated, including but not limited to NMOS and/or PMOS composite transistors.

The method 100 begins at 102, wherein transistor fabrication is initiated, and transistor well formation and isolation processing is performed at 104. Act 104 thus defines NMOS and PMOS regions illustrated in FIG. 2A, wherein NMOS regions comprise a P-well 206 in which n-type source/drain regions will later be formed, and PMOS regions comprise an N-well 208 in which p-type source/drain regions will later be formed, respectively. In addition, isolation regions may comprise shallow trench isolation (STI) or field oxide regions (FOX) 210 that serve to define various active areas and electrically isolate various active areas laterally from one another.

The method 100 continues at 106, wherein a gate oxide layer 212 is formed in active areas 211 defined by the various formed isolation regions 210. In one example, the gate oxide 212 comprises a thin, thermally grown silicon dioxide layer; however, other type gate dielectrics (such as high-k dielectrics) may be formed and are contemplated by the present invention. A conductive gate layer 214 is then deposited over the gate oxide 212 at 108 and patterned to form a conductive gate electrode 214. For example, a polysilicon layer may be deposited via chemical vapor deposition (CVD) and patterned via etching to form gate electrodes 214 in both the NMOS and the PMOS regions, respectively. At 110, a protective cap 218 is formed on top of the gate electrode after etching and protects the gate electrode from a subsequent etch to remove the source/drain region, as discussed infra. The protective cap 218 comprises an insulating material such as an oxide, a nitride or a combination of such layers. For example, a nitride layer is left remaining on top of the gate electrode.

An extension region implant 230, 236 is performed at 112. For example, lightly doped, medium doped or heavily doped extension region implants are performed in the NMOS and PMOS regions, or alternatively, the NMOS regions and PMOS regions may be implanted separately with differing dopants by mask off each region, respectively. Alternatively, the extension region implants are formed after the offset spacer at 114, wherein both are self-aligned with respect to the offset spacer, thereby placing both regions extremely close to the lateral edge of the gate structure within the semiconductor body. A thermal process such as a rapid thermal anneal is then employed to activate the extension region dopants, which causes the extension regions to diffuse laterally slightly underneath the offset spacer toward the channels.

An offset spacer 216 is formed on lateral edges of the conductive gate electrodes at 114. For example, a thin offset layer (e.g., an oxide or nitride layer) is formed generally conformably over the patterned gate and then etched using a generally anisotropic dry etch to remove the offset layer material on top of the gate and in the source/drain regions, leaving a thin offset spacer material on lateral edges of the gate. The offset spacer 216, as will be further appreciated below, is employed in this example to isolate the strain inducing material away from the channel region under the gate, for example, a distance of about 5 nm to about 20 nm. For example a distance of 5 nm may be chosen in this embodiment.

A first implant over the entire area of the gate structure and the source/drain regions is performed at 116 In one example, the implant is done with a high enough doping energy to penetrate through the protective cap 218 overlying the gate structure. For example, in this embodiment a doping energy of about 60 KeV can be used. In addition, the heavily doped ion concentration damages the silicon surrounding the source/drain regions implanted and further allows easy removal afterwards. In one example, the implant is performed at an angle relative to a plane normal to the surface. The source/drain implant is substantially normal to the surface of the semiconductor body, however, in alternative embodiments, the source/drain implant may be performed at some angle with respect to normal and such alternatives are contemplated as falling within the scope of the present invention. In such alternative embodiments, the angled implant is performed at a first angle, while the source/drain implant is performed at a second angle, wherein the first angle is larger than the second angle, as measured with respect to the plane normal to the surface of the semiconductor body.

Still referring to FIG. 1, the source/drain regions formed at 116 are specifically etched to recess substantially all or most of the first source/drain implant at 118 in the source/drain region. In one example, the recess is about 200 angstroms or less for an optimal depth for which to remove most of the first source/drain implant. In another example, the source/drain regions formed at 116 are etched to remove all of the first source/drain implant in that region. The protective cap 218 remaining on the poly gate structure 214 during formation at 110 protects the gate structure from being etched at 118 during removal of the source/drain regions. Therefore, the etch is selective to silicon versus the protective cap (a nitride, for example). The first implant damage typically makes the silicon easy to etch, wherein the nitride protective cap is amorphous so its etch rate is not affected by the implant.

Sidewall spacers can also be formed on the gate structures at 118. The sidewall spacers comprise an insulating material such as an oxide, a nitride or a combination of such layers. The spacers are formed by depositing layer(s) of such spacer material(s) over the device in a generally conformal manner, followed by an anisotropic etch thereof, thereby removing such spacer material(s) from the top of the gate structure and from the moat or active area and leaving a region on the lateral edges of the gate structure, overlying the offset spacers. The sidewall spacers 238 are thicker than the offset spacers, thereby resulting in the subsequently formed source/drain regions to be offset from lateral edges of the gate structure 224 at least about 60 nm.

The protective cap 218 is removed at 120 and source/drain regions are formed again by a source/drain implantation at 122, wherein a source/drain dopant is introduced into the exposed areas (top of gate electrode and active areas not covered by sidewall spacers). The implantation 122 is a doping concentration that is less than the implantation at 116 to specifically target the source/drain regions that were previously removed. In one example, the source/drain region is extended a deeper than the recess depth to about 300 angstroms deep. The methodology 100 therefore contemplates decoupling of the Tox versus SCE tradeoff so that an optimal amount of source/drain region is implanted without a harmful effect upon the gate electrode. The source/drain regions are completed with a thermal process to activate the dopant.

The method 100 concludes with silicide processing at 124, wherein a metal layer is formed over the device, followed by a thermal process, wherein the metal and silicon interfaces react to form a silicide (on top of the gate and in the source/drain regions). Un-reacted metal is stripped away, and back end processing such as interlayer dielectric and metallization layers are formed at 126 to conclude the device formation at 128. Stripping away un-reacted metal is a process well known by those of skill in the art.

The method 100 of the present invention advantageously minimizes the amount of leakage resulting from a non-optimal oxide thickness (Tox). By decoupling the implantation of the poly gate structure from the implantation in the source/drain regions, an optimal amount of Tox without using additional masking can be obtained.

Figure 2A:
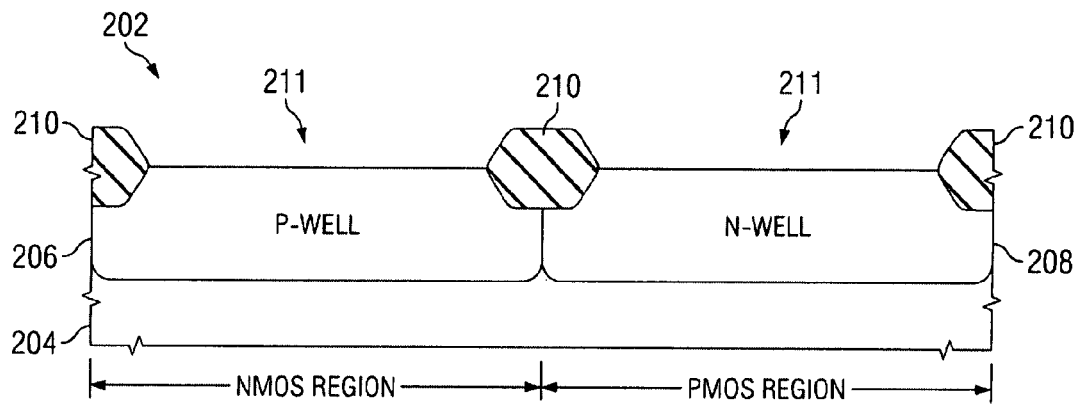
FIGS. 2A-2J are partial cross section diagrams illustrating various steps of forming NMOS and PMOS transistors in accordance with the invention of FIG. 1.
Figure 2B:
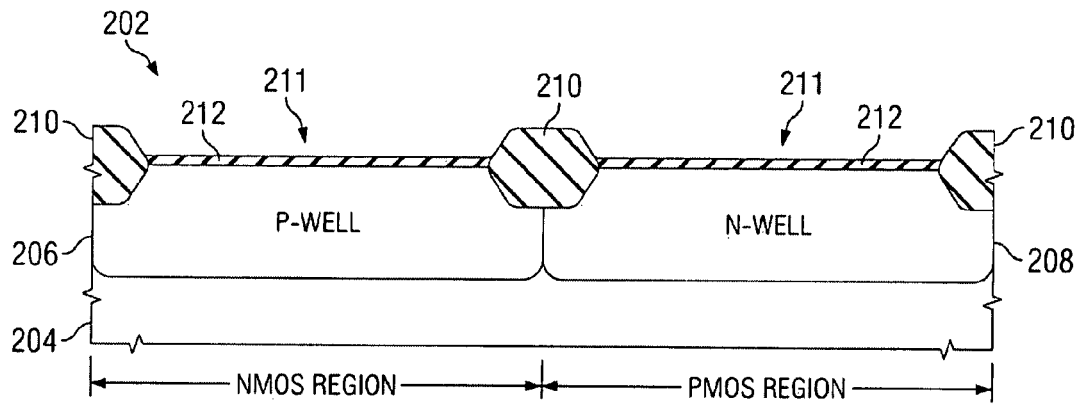

Turning now to FIGS. 2A-2J, partial cross section diagrams illustrating a transistor device being formed in accordance with the present invention of FIG. 1 are provided. In FIG. 2A, a transistor device 202 is provided, wherein a semiconductor body 204, such as a substrate, has a number of wells formed therein, such as a P-well 206 to define an NMOS transistor device region and an N-well 208 to define a PMOS transistor device region, respectively. Further, isolation regions 210 such as field oxide (FOX) or STI regions are formed in the semiconductor body to define active area regions 211, as may be appreciated. In FIG. 2B, the transistor device 202 is illustrated, wherein a gate dielectric 212 has been formed, for example, thermally grown $SiO_2$, over the active areas 211.

Figure 2C:
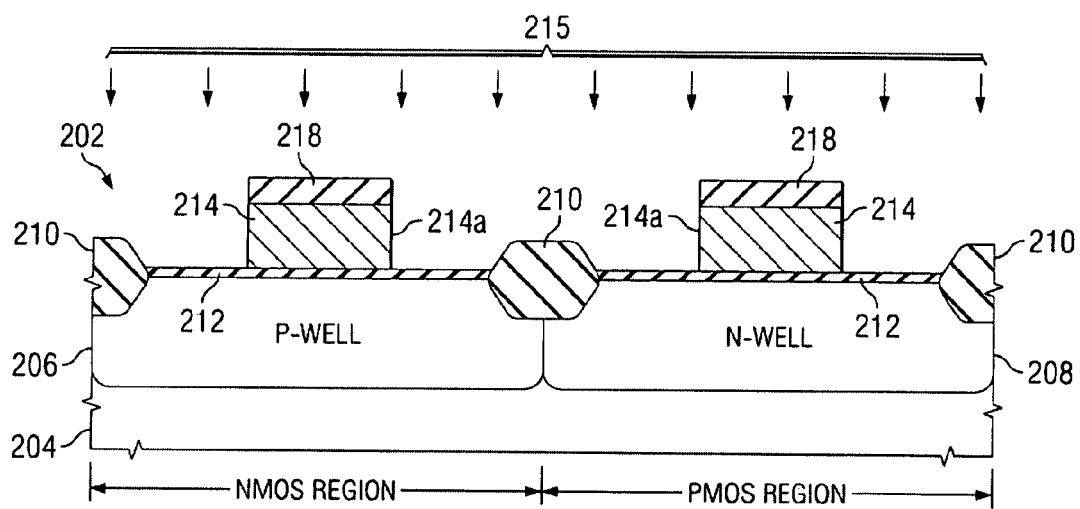
Figure 2D:
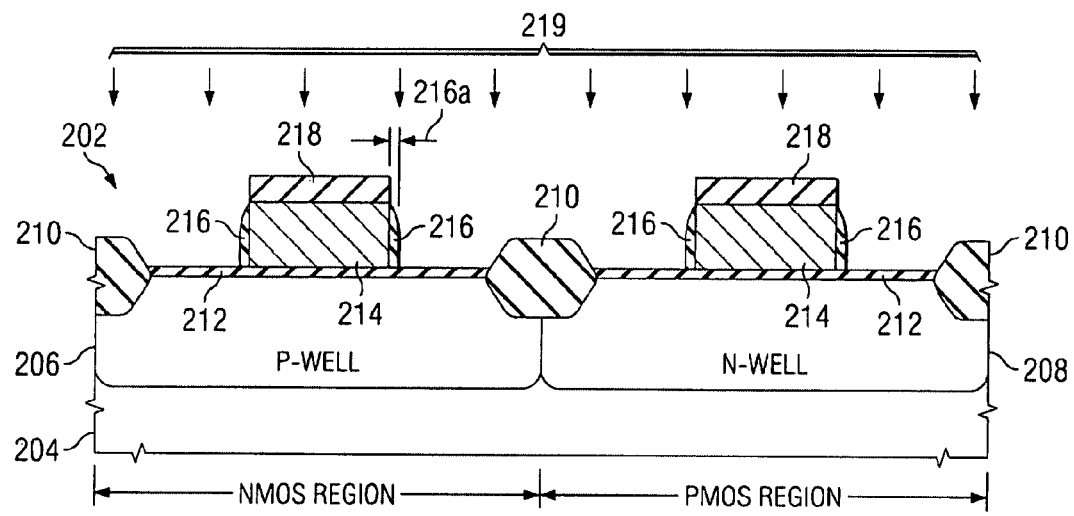

Referring to FIGS. 2C and 2D, a conductive gate electrode material (e.g., polysilicon) has been deposited and patterned via an etching process 215 to form a gate electrode 214 overlying the gate oxide 212. On top of the gate electrode 214 remains a protective cap 218. The protective cap 218 is left on top of the gate electrode during etching and protects the gate electrode from removal of the source/drain implant, as discussed infra. The protective cap 218 comprises an insulation material comprising an oxide, nitride or a combination thereof. For example, a nitride protective cap may be present.

In addition, a thin offset spacer 216 in FIG. 2D, such as an oxide or other dielectric material may be formed on lateral sidewalls of the gate structures 214 wherein the offset spacers have a width 216a of about 10-50 nm. The offset spacers 216 may be formed prior to the formation of the extension region or in another embodiment may be formed after the extension region formation. Alternatively, extensions regions may subsequently be formed without any formation of spacers.

Figure 2E:
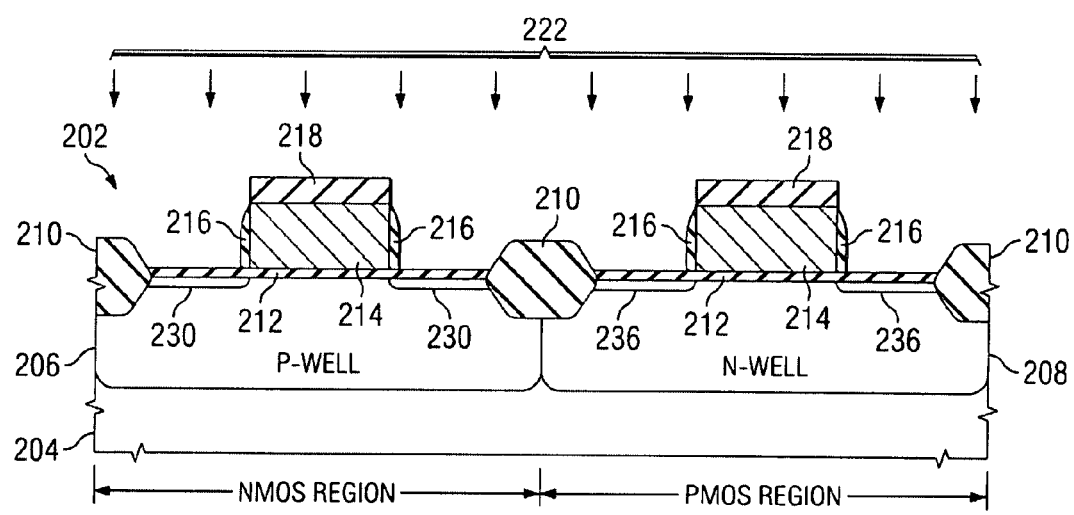

As illustrated in FIG. 2E, an implant 222 is illustrated generically to show formation of extension regions 230, 236 in exposed active areas. As will be appreciated, however, the extension regions 230, 236 in the NMOS and PMOS regions are different and are performed separately with masking steps (not shown). For example, NMOS n-type extension regions. 230 are formed with an n-type implant into the p-well 206 while the PMOS region is covered with a mask. Similarly, PMOS p-type extension regions 236 are formed with a p-type implant into then n-well 208 while the NMOS region is covered with a mask. Further, while a discussion of the formation of the extension regions is together, they may be formed at other times in the fabrication process, and all such alternatives are contemplated as falling with the scope of the invention.

Figure 2F:
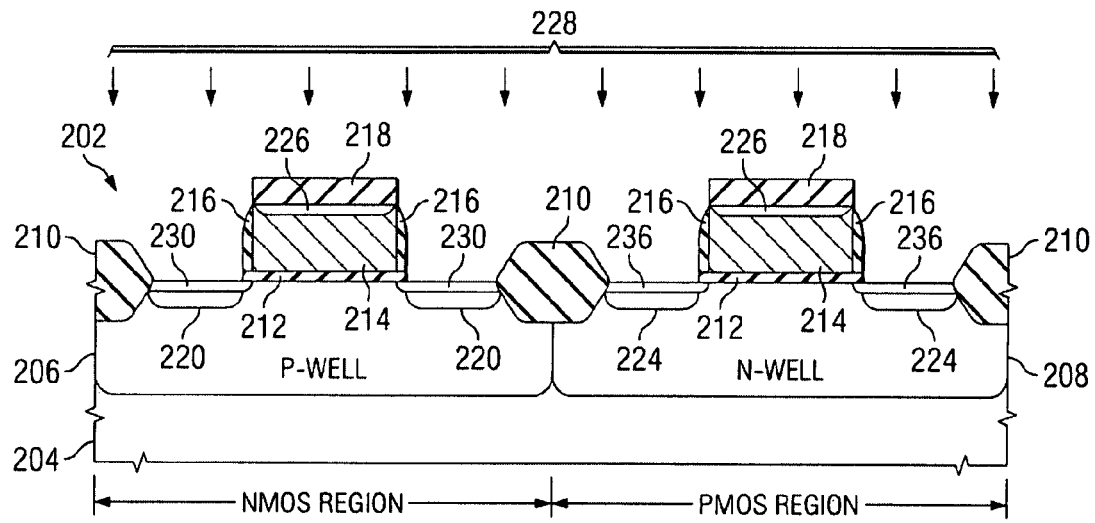

Following the formation of the protective cap 218, a first source/drain implant—228 is performed at FIG. 2F. The first source/drain implant 228 is over the entire area of the gate structure and the source/drain regions. In one example, the implant is done with a doping energy high enough to penetrate through the protective cap overlying the gate structure. For example, about 60 KeV can be used depending on the thickness of the protective cap. In addition, the high energy heavy doped concentration also damages the silicon surrounding the source/drain regions implanted for their easy removal at another etch, as discussed infra. In one example, the implant is performed at an angle. The source/drain implant is substantially normal to the surface of the semiconductor body, however, in alternative embodiments, the source/drain implant may be performed at some angle with respect to normal and such alternatives are contemplated as falling within the scope of the present invention. In such alternative embodiments, the angled implant is performed at a first angle, while the source/drain implant is performed at a second angle, wherein the first angle is larger than the second angle, as measured with respect to a plane normal to the surface of the semiconductor body.

In one example, an at least one angled first implant may be performed to dope the gate structures 214. It should be understood that the angled first implant dopant is the same conductivity type as that employed for the source/drain regions of the respective transistor device. That is, for an NMOS device the angled implant and source/drain implant are both an n-type dopant. Similarly, for a PMOS type device both the angled implant and the source/drain implant are p-type implants. This distinguishes the angled implant of the present invention from a conventional halo or pocket implant that is employs an opposite conductivity type dopant than used for the respective source/drain. In one embodiment of the invention, the angle of the angled implant is about 55 degrees or greater (measured from an angle normal to the semiconductor body surface), wherein pocket or halo implants are typically at an angle of about 20-30 degrees.

In addition, in one embodiment a relative dose of the angled implant compared to conventional halo or pocket implants is greater by about two orders of magnitude. In one embodiment, the angled implant of the present invention is about 1E15 to 4E15 ions/cm$^2$, for example about 2E15 ions/cm$^2$ compared to a conventional halo or pocket implant of about 1E13 to 8E13 ions/cm$^2$. Further still, the energies employed in the angled implant of the present invention differ from the halo or pocket implants due to their desired function. For example, in one embodiment the angled implant of the invention has a energy in the range of about 1-5 keV (depending on the dopant species), whereas a conventional halo or pocket implant has an energy in the range of about 10-50 keV due to the differing target depths of the implants. For p-type implants of boron the energies are normally in the range of 5-15 keV, whereas for n-type implants of arsenic the energies are in the 35-60 kev range.

While an angled implant (not shown) may occur in both NMOS and PMOS regions concurrently, it should be noted that in one embodiment of the invention, the angled implant comprises two angled implants, wherein in each case one of the NMOS and PMOS regions is appropriately masked. For example, in one embodiment, the PMOS region is masked, and an n-type angled implant is performed, thereby causing the n-type dopant to implant into the NMOS region gate structures 214, while a shadowing structures in the NMOS region may cause such dopant to not substantially reach the exposed active areas 211. Further, in performing an angled implant in the PMOS region, the NMOS region is masked, and the dopant of the angled p-type implant reaches the PMOS gate structures, thereby causing such gate structures to be implanted with p-type dopant, while any shadowing structures in the PMOS region cause such dopant to not substantially reach the exposed active areas 211.

Source/drain regions 220 and 224 are then formed in the NMOS and PMOS regions, respectively along with a doped region 226 below the protective cap 218. In one example the source and drain regions 220 and 224 are formed in conjunction with the extension region implants. The source/drain implants 228 are performed with an NSD mask (not shown) and then a PSD mask (not shown) in order to implant the NMOS region and the PMOS region separately with n-type and p-type dopant, respectively. As can be seen in FIG. 2F, the source/drain regions 220, 224 are self-aligned with respect to the sidewall spacers, and thus are laterally spaced from the extension regions 230, 236.

In the above embodiment the source drain implant is substantially normal to the surface of the semiconductor body, however, in alternative embodiments, the source/drain and gate structure implant may be performed at some angle with respect to normal and such alternatives are contemplated as falling within the scope of the present invention. In such alternative embodiments, the angled implant is performed at a first angle, while the source/drain implant is performed at a second angle, wherein the first angle is larger than the second angle, as measured with respect to a plane normal to the surface of the semiconductor body.

Figure 2G:
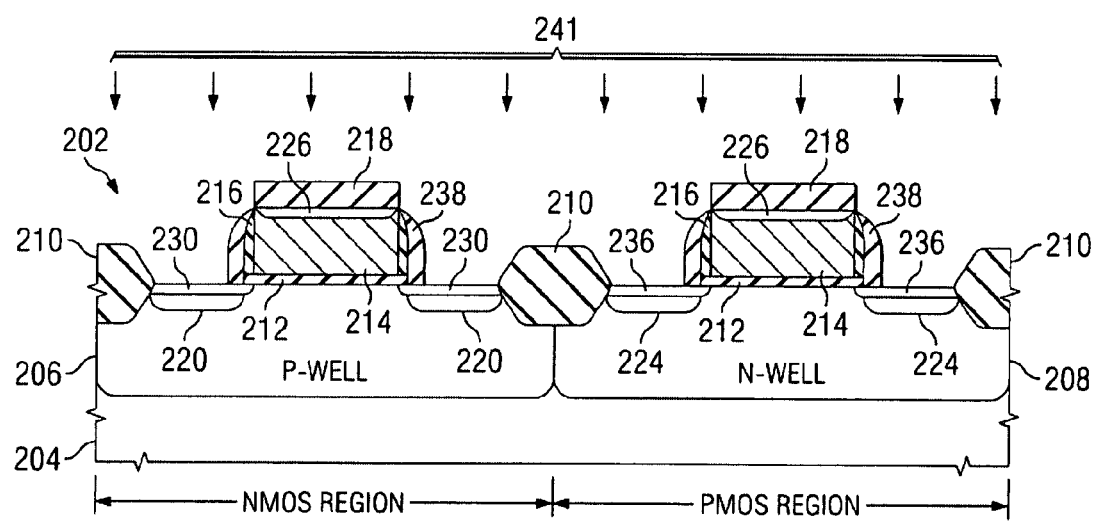

In one embodiment, illustrated in FIG. 2G, sidewall spacers 238 are formed. The sidewall spacers 238 comprise a dielectric material such as a silicon nitride and are formed by a substantially conformal deposition via CVD, for example, followed by a substantially anisotropic etch (e.g., a dry etch) at 241. Resultant sidewall spacers are thus formed on lateral sidewalls of the gate structures 214, as illustrated in FIG. 2G at 238. Further, while a discussion of the formation of the sidewall spacers are together, they may be formed at other times in the fabrication process, and all such alternatives are contemplated as falling within the scope of the invention.

Figure 2H:
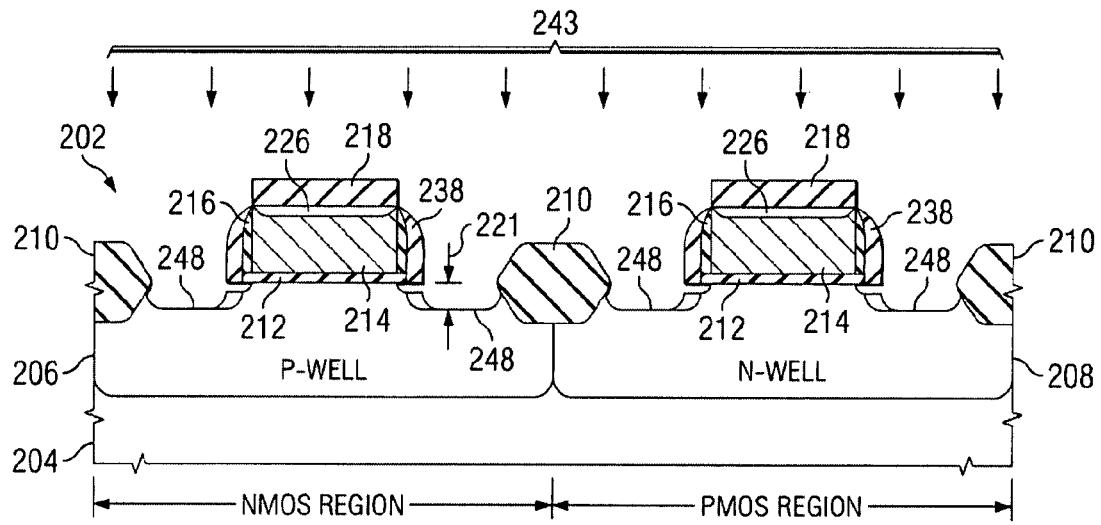

Recesses 248 are then formed at FIG. 2H in the source/drain regions using an etch process 243, wherein the gate electrode 214 is protected by the protective cap 218. The recesses 248 are formed into the semiconductor body to a depth 221 of about 10-90 nm, and more preferably about 30-70 nm, for example. In one example, all of the heavy source/drain implant 228 is removed by the subsequent etch 243. In another example, substantially all of the source/drain implant 228 is removed. Although the example illustrated herein has the recesses 248 formed after an offset spacer 216, such recesses may be formed prior to such a spacer, wherein in such instance the recesses 248 are aligned to the lateral edges 214a of the gate structures.

Figure 2I:
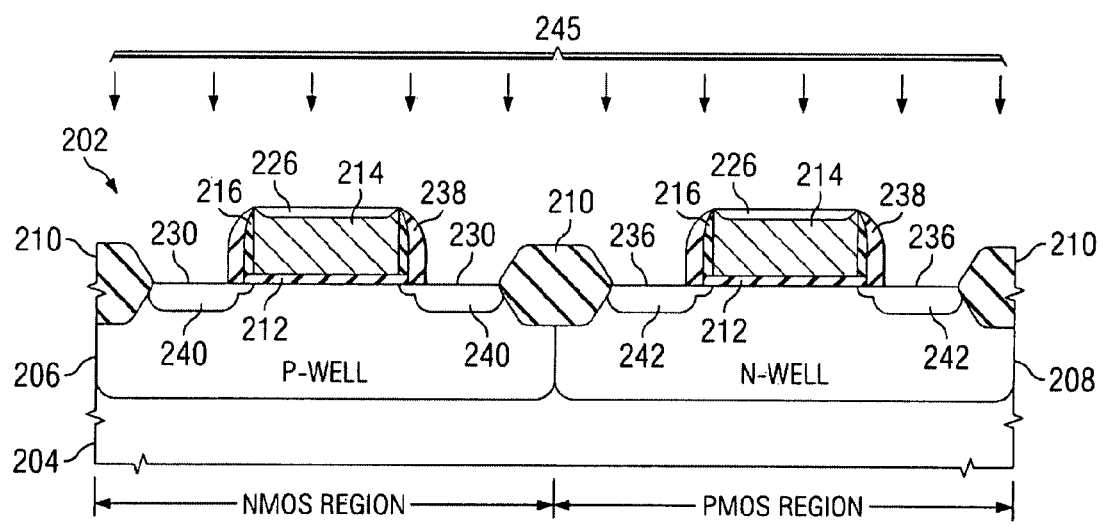

As illustrated in FIG. 2I, the protective cap 218 is then removed. A second lighter implant dose 245 is then performed at the source/drain regions 220 and 224 to give the correct amount of doping for optimal Tox without compromising SCE. In one embodiment the source/drain implant is substantially normal to the surface of the semiconductor body, however, in alternative embodiments, the source/drain implant may be performed at some angle with respect to normal and such alternatives are contemplated as falling within the scope of the present invention. In such alternative embodiments, the angled implant is performed at a first angle, while the source/drain implant is performed at a second angle, wherein the first angle is larger than the second angle, as measured with respect to a plane normal to the surface of the semiconductor body.

Figure 2J:
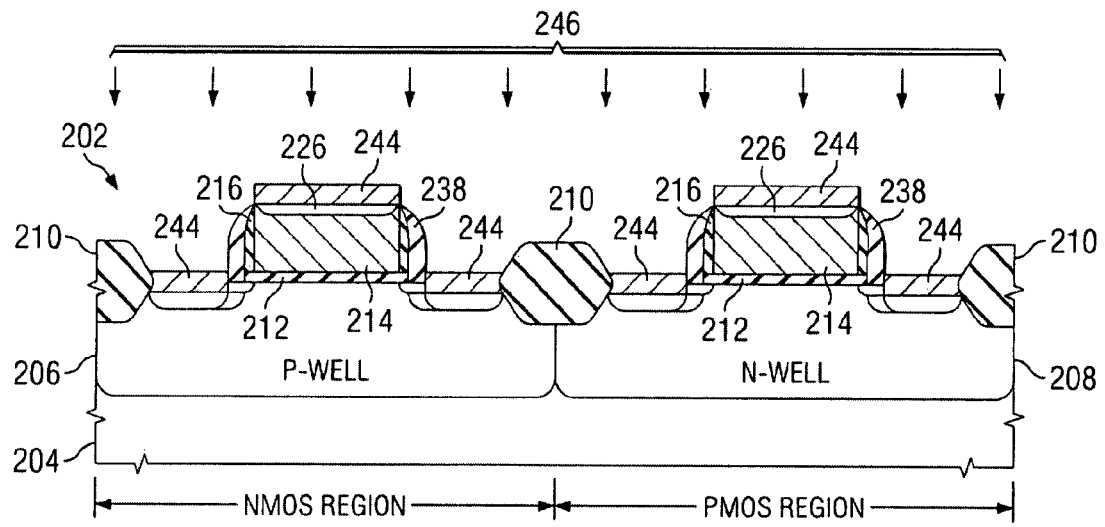

The method then concludes with silicidation, wherein a metal layer is deposited, for example, via sputtering, over the device, followed by a thermal process 246. During the thermal processing, those regions where the metal contacts silicon reacts to form a metal silicide 244, as illustrated in FIG. 2J. More particularly, the silicide 244 forms on the source/drain regions and on top of the gates as illustrated. Subsequently, back end processing including metallization may be performed to interconnect the various transistors, as may be desired.

Figure 3:
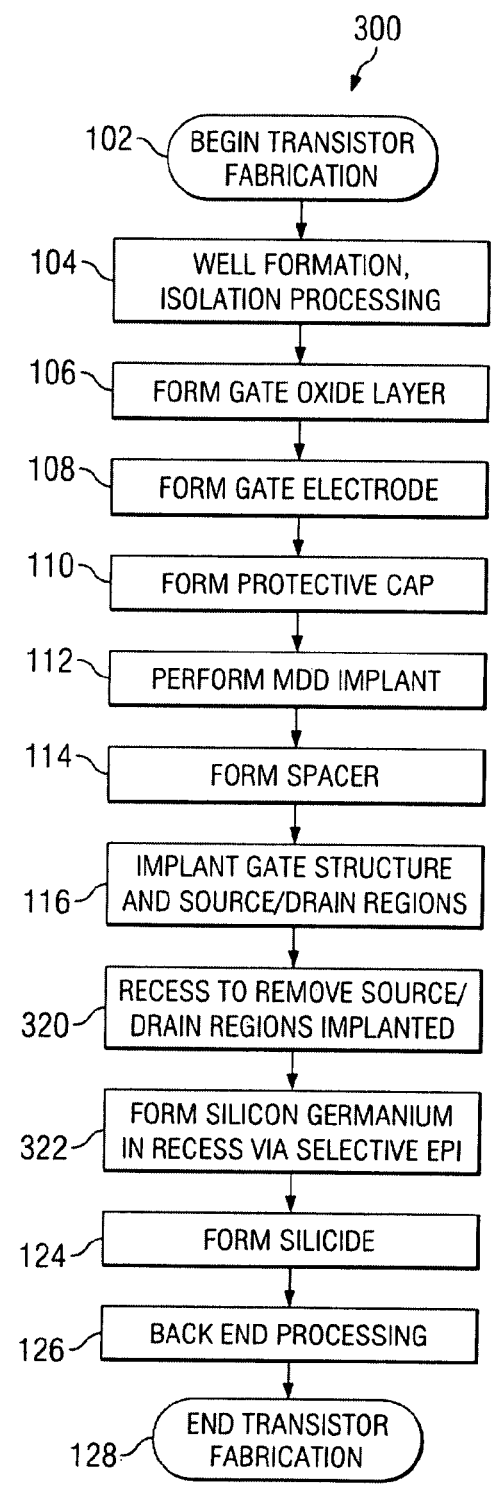
FIG. 3. is a flow chart diagram illustrating a method of forming a transistor having improved Tox according to another aspect of the present invention.

In accordance with another aspect of the invention, FIG. 3 is a flow chart directed to another method of forming a transistor device having improved mobility due to a decoupling of the Tox-SCE tradeoff inherent in conventional methods and is designated at reference numeral 300. The method. 300 is similar in many respects to the method 100 of FIG. 1, and with regards to such aspects, those portions will not be repeated again. For example, acts 102-116 may proceed generally in the same manner as method 100. Recesses are then formed in the source/drain regions at 320 after the entire structure comprising both the gate structure and source/drain regions has been implanted with a heavy dose concentration. A silicon germanium material is then formed in the recesses at 320. The recess is formed using, for example, a dry etching process such as the chemistry employed to etch STI trenches in the semiconductor body when forming isolation regions. The recesses, in one example extend into the semiconductor body to a depth of about 10-90 nm, and more preferably about 30-70 nm. In the present example, the gate structure is masked during the recess formation; therefore if the gate electrode is composed of polysilicon, the recess formation process will not result in a recess formed in a top portion of the gate electrode material.

The method 300 then continues at 322, wherein silicon germanium is formed in the recesses. In one example, the silicon germanium is formed via a selective epitaxial deposition process such as an LPCVD (low pressure chemical vapor deposition) process using dichlorosilane and germane as the source gases. In one alternative of the present invention, the above reactants are employed to form SiGe in the recesses and subsequently the SiGe is subjected to a p-type implant to form a p-doped SiGe material (e.g., using Boron). Alternatively, and more preferably, the SiGe is doped in-situ during the selective epi deposition process by incorporating a p-type dopant reactant in the CVD process. For example, diborane or other type reactant may be employed, wherein a boron doped SiGe material is formed in the recesses (or other p-type dopant in the SiGe, as may be appreciated). The in-situ boron doping of the SiGe is preferred because it is believed that the in-situ doped boron is activated to a higher degree than when implanted into the SiGe, and therefore advantageously provides a lower extension region resistance.

While not intending to be limited to any one theory, it is believed that the silicon germanium within the recesses form an alloy that has a lattice with the same structure as the silicon body lattice, however, the silicon germanium has a larger spacing. Consequently, it is believed that the silicon germanium within the recesses will tend to expand, thereby creating a compressive stress within the channel of the semiconductor body underneath the channel.

If the SiGe material is not doped in-situ as, an extension region implant is subsequently performed, wherein dopants are introduced into the silicon germanium material in the recesses. For example, lightly doped, medium doped or heavily doped extension region implants are performed in the NMOS and PMOS regions, or alternatively, the NMOS regions and PMOS regions may be implanted separately with differing dopants by mask off each region, respectively. Since both the recesses (now filled with silicon germanium) and the extension region implants are formed after the offset spacer, both are self-aligned with respect to the offset spacer, thereby placing both regions extremely close to the lateral edge of the gate structure within the semiconductor body. A thermal process such as a rapid thermal anneal is then employed to activate the extension region dopants, which causes the extension regions to diffuse laterally slightly underneath the offset spacer toward the channels.

The method 300 may then proceed at 124-128 in a manner similar to that of method 100. Consequently, the method 300 indicates that the order in which the extension regions are formed and the recesses are formed may be switched, and either alternative is contemplated as falling within the scope of the present invention.

The method 100 of the present invention advantageously minimizes the amount of leakage resulting from a non-optimal oxide thickness (Tox). By decoupling the implantation of the poly gate structure from the implantation in the source/drain regions, an optimal amount of Tox without using additional masking can be obtained.

Having the silicon germanium region at the optimal depth in the active region and decoupled from the implantation of the gate structure provides for a substantial improvement over the prior art in that there is substantially less degradation of the gate structure during fabrication and an optimal current flow without punchthrough may be obtained. Consequently, less germanium is needed and few threading dislocation defects are generated, thereby resulting in substantial performance improvements over the prior art, for example, reduced leakage. In addition, in the instance where the SiGe material is doped in-situ with boron, it was found that the extension region resistance was decreased. Accordingly, with an approximate 35% PMOS device improvement, it was estimated that about 28% of the improvement is from improved stress, while about 7% is due to the extension region resistance improvement.

Figure 4A:
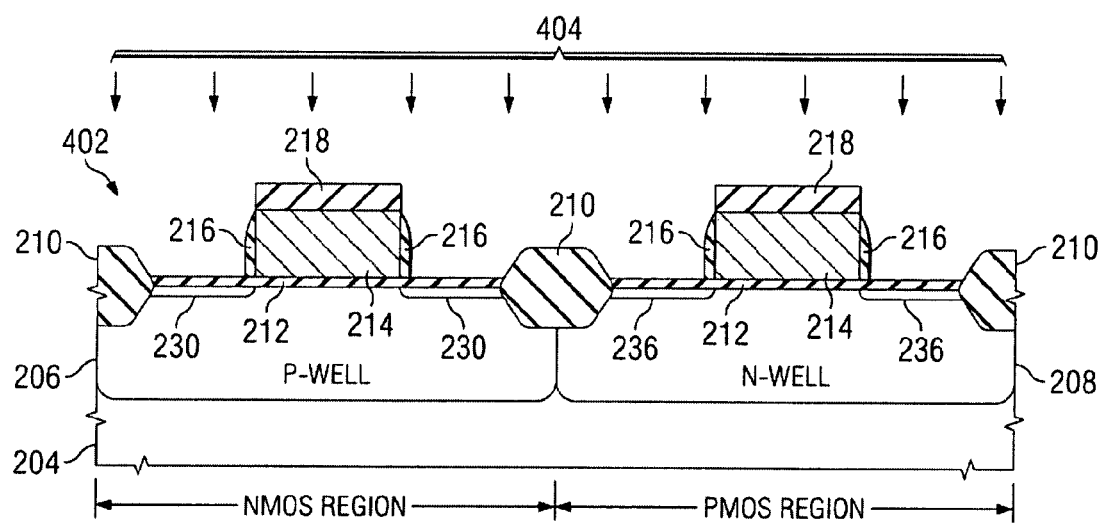
FIGS. 4A-4F are partial cross section diagrams illustrating various steps of forming NMOS and PMOS transistors in accordance with the invention of FIG. 3.

FIGS. 4A-4F illustrate the fabrication of the transistor devices in accordance with the method 300 of FIG. 3. As illustrated in FIG. 4A, a transistor device has NMOS and PMOS regions as before with P-well and N-well regions 206 and 208 formed in a semiconductor body 204. Isolation regions 210 also are provided to define active areas for fabrication of transistor devices. A gate oxide 212 overlies the active regions and a patterned conductive gate electrode 214 is formed thereover. A nitride cap 218 remains over top of the gate electrode 214 at 110. In contrast to the method 100, the protective nitride cap 218 remains on top of the gate electrode and is not etched prior to any subsequent implant in the method 300. Offset spacers 216 reside on lateral edges of the gate 214 and an extension region implant process 404 (e.g., an n-type followed by a p-type) is provided in conjunction with appropriate masking to form extension regions 230 and 236, respectively. A subsequent thermal anneal causes the extension regions 230 and 236 to diffuse laterally and extend slightly under the offset spacers 216.

Figure 4B:
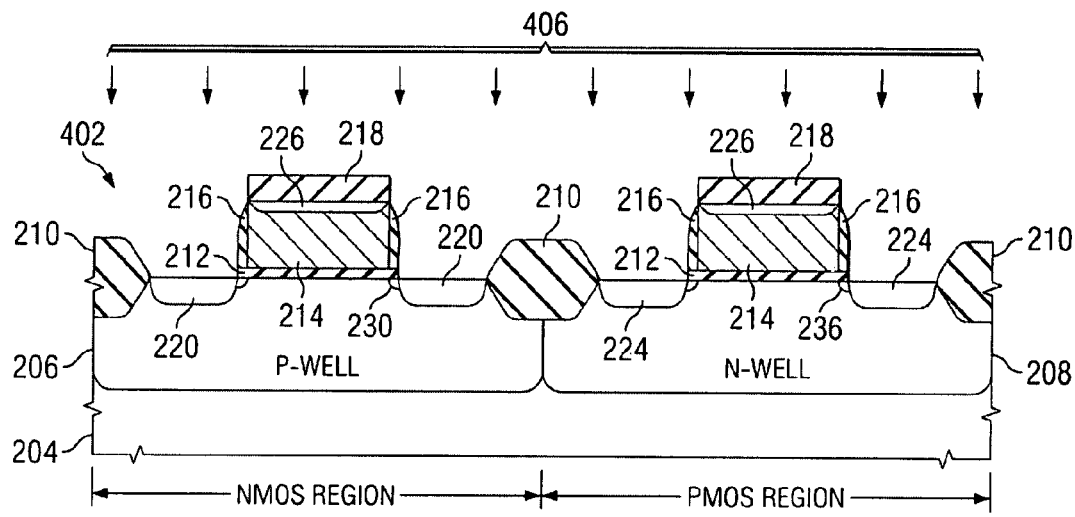
Figure 4C:
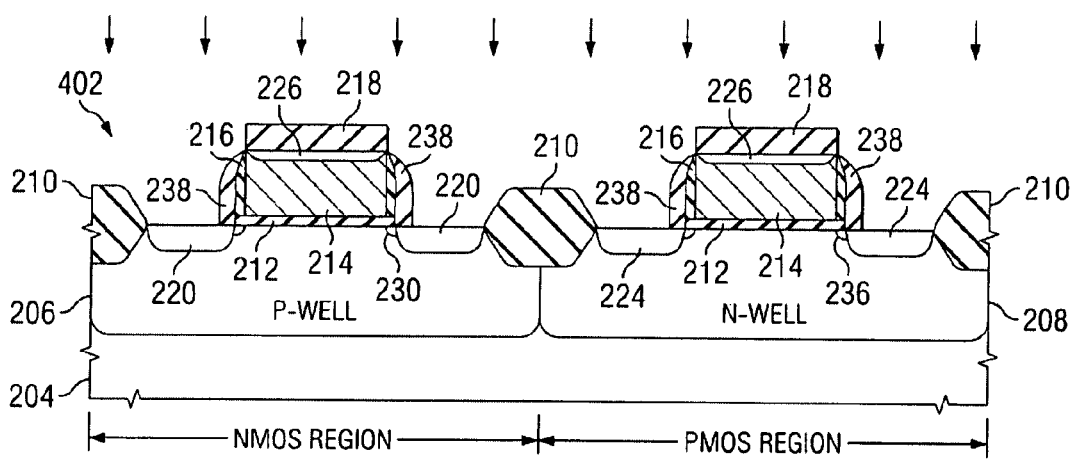
Figure 4D:
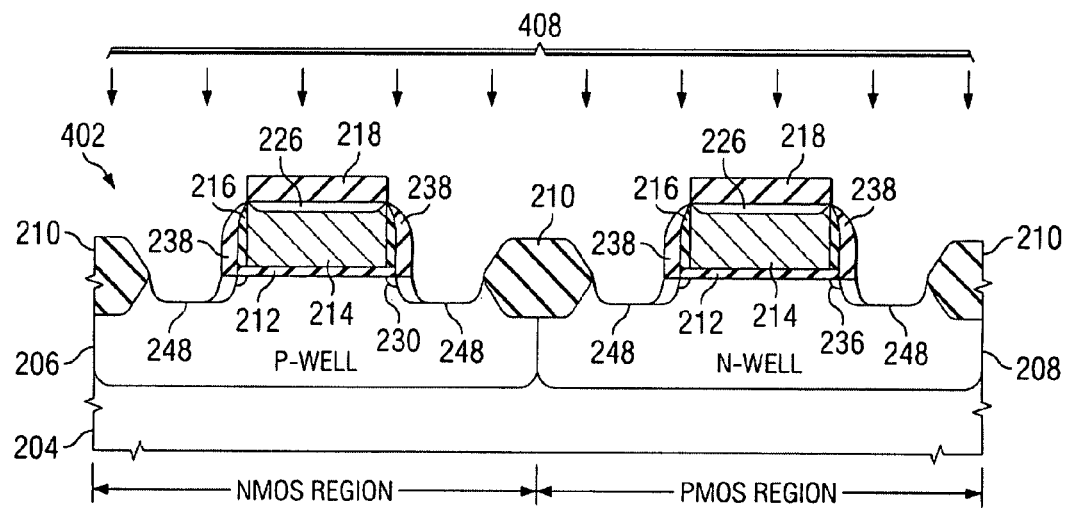

FIGS. 4B-4D progress similarly to that described in the previous method, wherein sidewall spacers 238 are formed, followed by the source/drain implant 406 at FIG. 4B (in NMOS regions and then PMOS regions, respectively with appropriate masking not shown) and wherein at least one angled implant may be formed. Note that after the source/drain implants 220 and 224, a thermal process is employed to activate the dopants, which causes some lateral diffusion thereof, thereby causing the source/drain regions to connect with the respective extension regions 230 and 236.

Figure 4E:
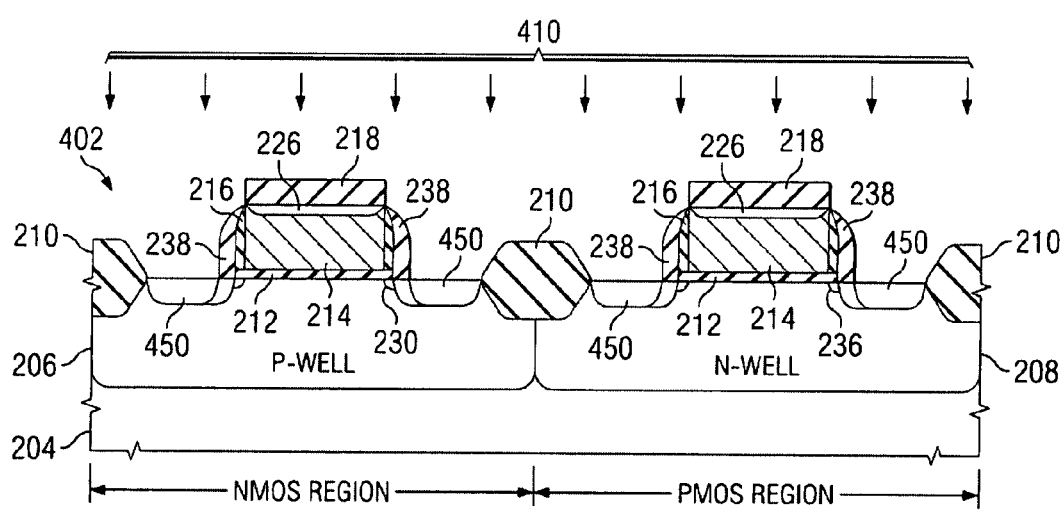

Recesses 248 are then formed in the active areas after the extension region implant via an etch process 408, as illustrated in FIG. 4D. Because the extension regions have diffused slightly under the offset spacers 216 and the recesses are self-aligned with respect to the spacers, small portions of the extension regions remain near the channel, as illustrated. A silicon germanium material 450 is then formed in the recesses as illustrated in FIG. 4E, via a selective epitaxial deposition process 410. Although the example illustrated herein has the recesses 248 formed after an offset spacer 216, such recesses may be formed prior to such a spacer, wherein in such instance the recesses 248 are aligned to the lateral edges 214a of the gate structures.

Turning now to FIG. 4E, a selective epitaxial deposition process 410 is provided, wherein a silicon germanium material 450 is formed in the recesses 248. As highlighted above, the process may comprise an epitaxial deposition process, wherein a germanium containing source gas such as germane is added to the silane or dichlorosilane, such that a silicon germanium material is formed in the recesses. Further, in one example, the selective epi process further includes a diborane source gas to provide for the SiGe to be doped with boron in-situ. Alternatively, other p-type source gases may be employed, as may be appreciated.

Alternatively, the SiGe material may be formed in the recesses 248. Alternatively in one example (not shown), the SiGe may alternatively be subsequently doped with a p-type dopant to form a p-type extension region in the PMOS region if an extension region had not previously been formed. In such case, the PMOS region is then masked off with a masking material such as photoresist, and an extension region implant 230 is performed to form n-type extension regions 230 in the NMOS region. If the SiGe material is p-type doped in-situ, the n-type extension region can be made greater to offset such p-type dopant therein, as may be appreciated. A thermal process such as a rapid thermal anneal is then performed to activate the dopant, wherein a lateral diffusion of the extension regions 230 under the offset spacer 216 is achieved.

The p-type extension region mask is then removed, and a n-type extension region mask is deposited and patterned to cover the NMOS region. A p-type extension region implant process is then performed to form p-type extension regions 236 in the PMOS region, as illustrated. As stated above, if the SiGe is formed with p-type doping in-situ, the p-type extension region masking and implant may be skipped.

Figure 4F:
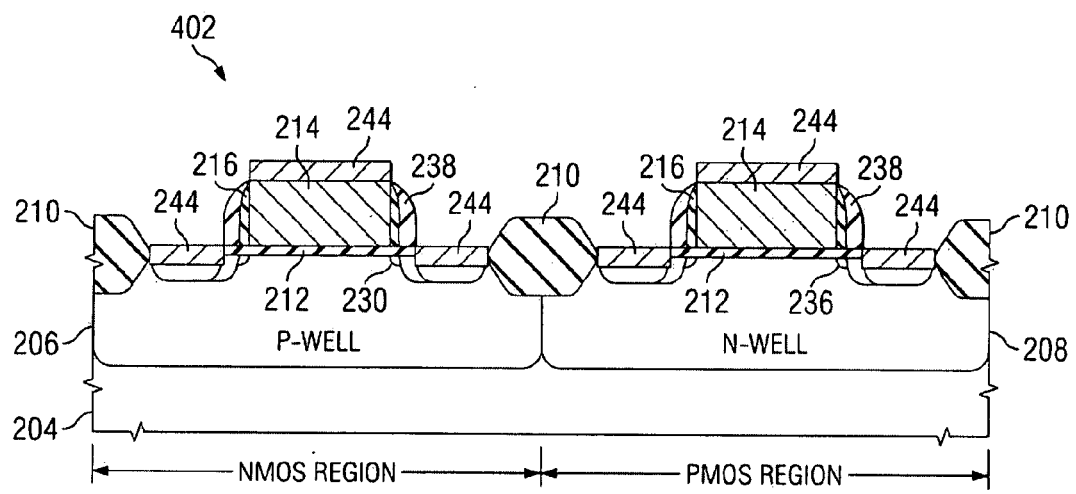

FIG. 4F then progresses similarly to that described in the previous method, wherein silicidation occurs for subsequent metallization and back end processing.

In the methods of FIG. 3, the recesses and a SiGe selective epitaxial process are performed in both the NMOS and the PMOS regions. The inventors of the present invention discovered that although the compressive stress provided by the SiGe effectively improves hole mobility substantially for PMOS performance improvement, that the presence of germanium in the NMOS regions may, in some instances, have a substantial deleterious impact on electron mobility in the NMOS regions. Accordingly, the present invention contemplates another alternative aspect of the present invention, wherein the recesses and filling thereof with boron doped silicon germanium material may be performed solely in the PMOS regions of the device, as will be discussed below and illustrated in conjunction with FIGS. 5 and 6A-6C.

Figure 5:
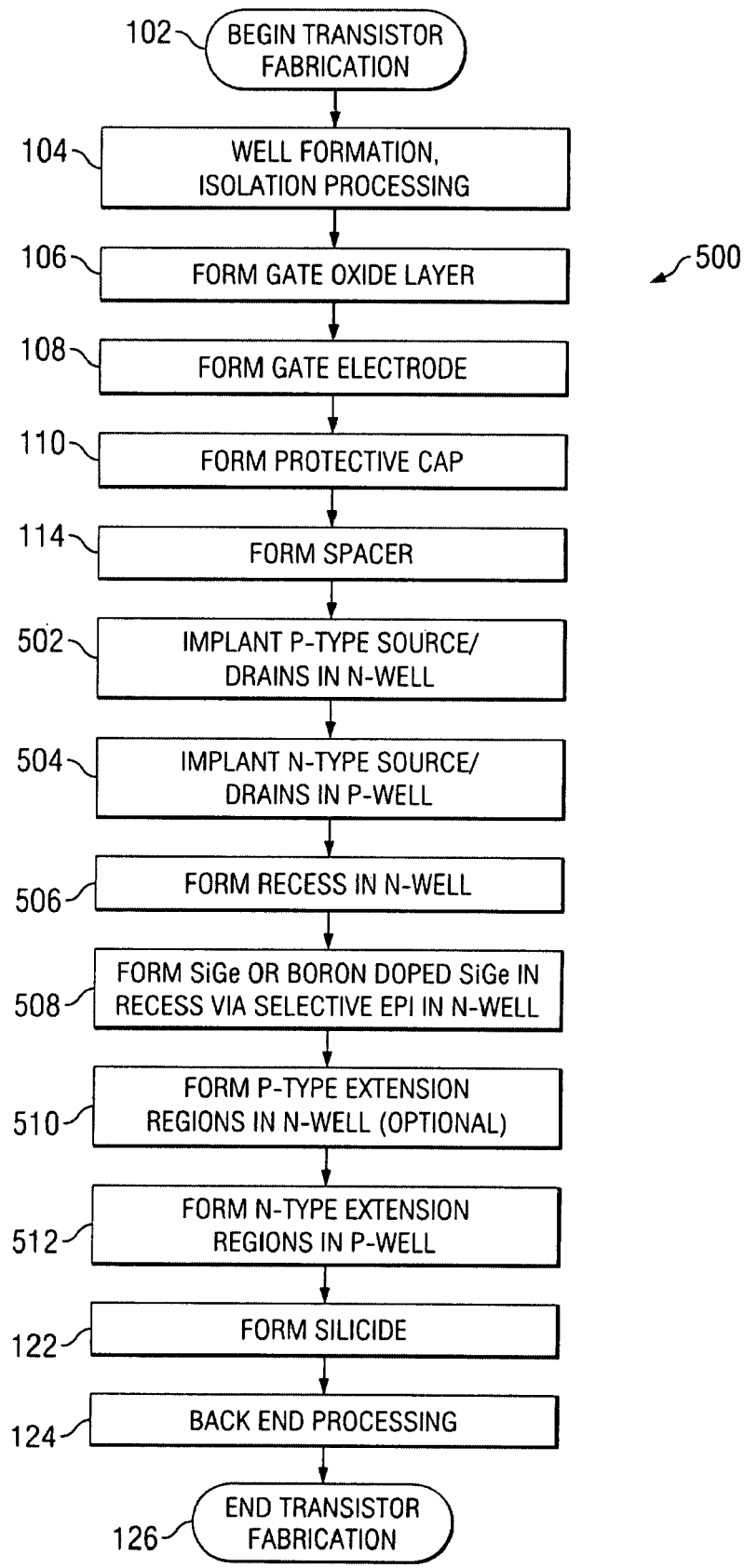
FIG. 5 is a flow chart diagram illustrating a method of forming a transistor having improved Tox according to yet another aspect of the present invention.

Turning now to FIG. 5, a method 500 is disclosed wherein a PMOS transistor is formed in a CMOS process that exhibits improved Tox using Si recessing without the use of additional mask. Acts 102-110 may proceed in a manner similar to that discussed supra, with a protective cap comprising an oxide, nitride, or combination thereof remaining on top of the gate structure. At 502, a mask is deposited and patterned to cover the NMOS region and a p-type source/drain implant is performed therein to form p-type source/drain regions that are self aligned with respect to the spacers and also implant the gate structure through the protective cap 218. The implant dose concentration is strong enough to penetrate through the protective cap to implant the gate structure. The mask is then removed and a second mask is provided to cover the PMOS regions, and an n-type source/drain implant is performed at 504 in the NMOS regions to form n-type source/drain regions therein that are self-aligned with respect to the spacers and implant the gate structure as well.

At 506, a moat recess is selectively formed in an N-well (a PMOS region) by masking off the P-well (the NMOS region) and performing a silicon etch after the formation of offset spacers on the sidewalls of the gate electrodes. Boron or other p-type doped silicon germanium is formed in the recesses (in the active areas as well as on top of the gate electrode) via a selective epi deposition process in the PMOS region at 508 while the mask is maintained on the NMOS region, thereby preventing such material to form therein.

If the SiGe is not p-doped during selective epi deposition, p-type extension regions are then formed at 510 with the mask still in place, thereby doping the silicon germanium material within the recesses with p-type dopants, if desired. A thermal process then causes the p-type dopant to diffuse laterally under the offset spacers, and toward the channel. Alternatively, the p-type extension regions may be formed prior to forming the recesses.

The method 500 continues at 512 by removing the mask in the NMOS region, depositing and patterning another mask over the PMOS region, and performing an n-type extension region implant into the P-well in the NMOS region to form n-type extension regions that are self-aligned with respect to the offset spacers. The mask is then removed. Silicide processing 122 and back end processing 124 may then proceed in a typical manner.

Figure 6A:
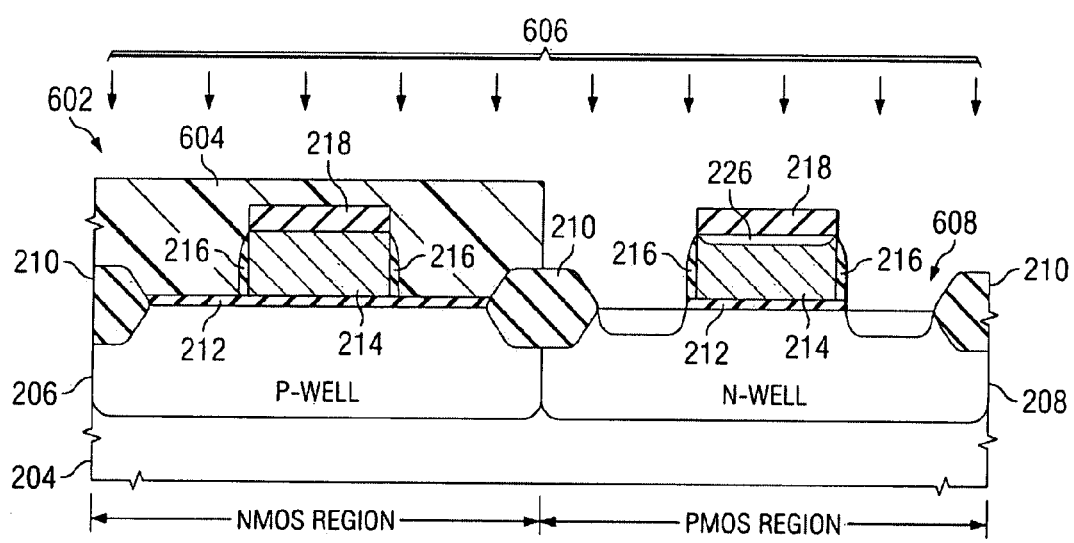
FIGS. 6A-6C are partial cross section diagrams illustrating various steps of forming an NMOS transistor in accordance with the invention of FIG. 5.

In FIG. 6A, the device 602 is illustrated with a mask 604 over the NMOS region and a nitride cap 218 over the gate structure 214. A p-type source/drain implant 606 is performed in the PMOS region to form the source/drain regions 224. The mask 604 is then stripped, and another mask 614 is formed to cover the PMOS region, and an n-type source/drain implant process 624 is provided to form n-type source/drain regions 220, as illustrated in FIG. 6C.

Figure 6B:
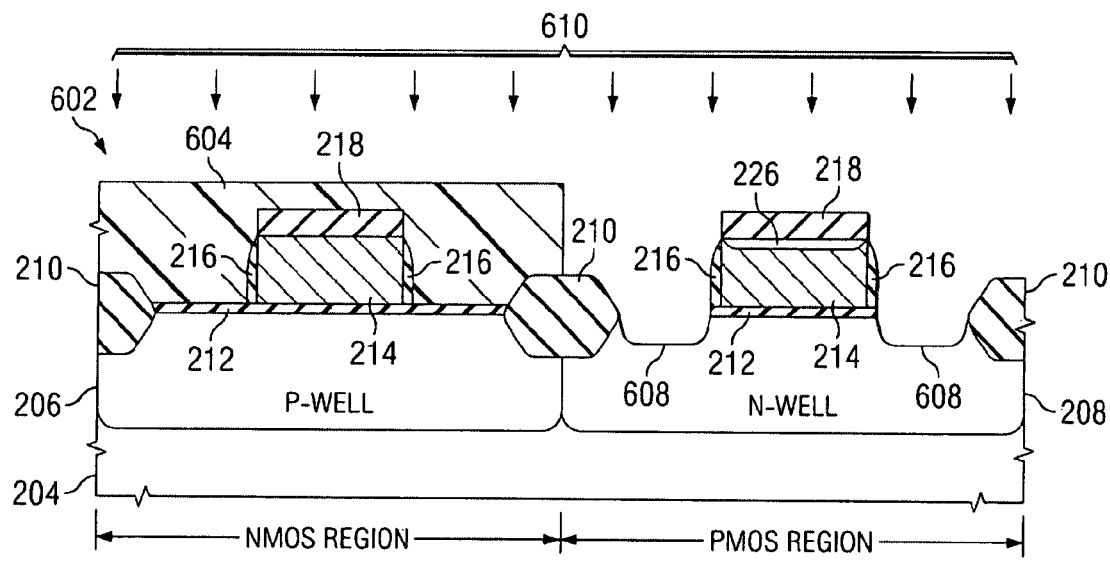
Figure 6C:
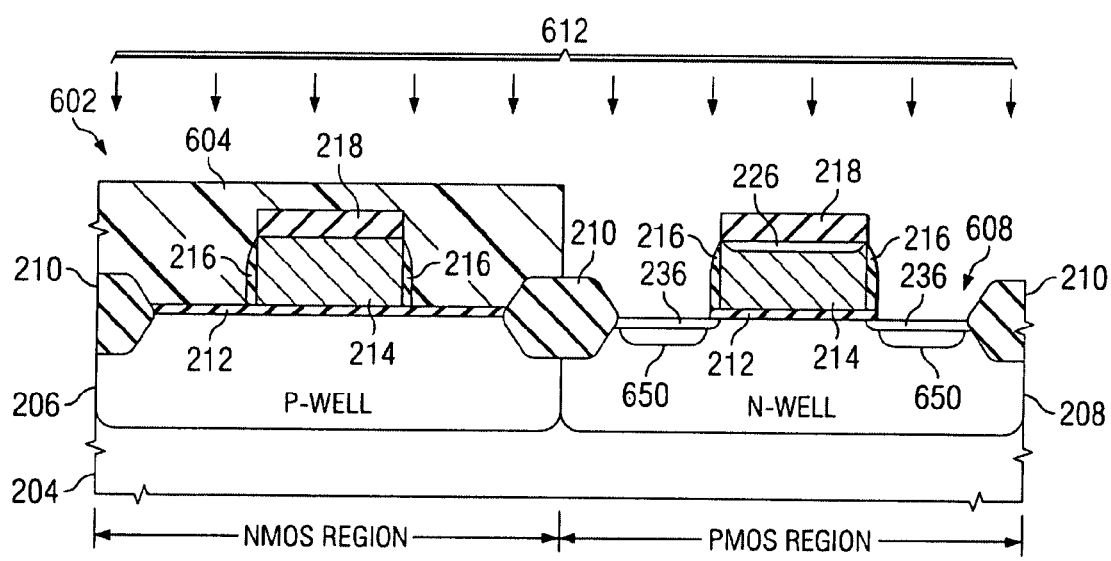

In FIG. 6B, an etch process 610 is performed to form the recesses 608 in the active areas defined by the offset spacers 216 and the isolation regions 210. In FIG. 6C, a selective epitaxial deposition process 612 is performed, wherein a silicon germanium material 650 is formed in the recesses 608 while the mask 604 continues to mask the NMOS region. In one example, the selective epi process 612 further includes a p-type dopant such as boron, wherein the resultant material comprises boron doped silicon germanium 650. Alternatively, the PMOS region is then subjected to a p-type extension region implant 612, wherein the p-type extension regions 236 are formed (FIG. 6C) into the SiGe material 650. A subsequent thermal anneal causes the extension regions to diffuse laterally slightly under the offset spacers. The mask 604 is then removed, and another mask 614 is formed and patterned to overlie the PMOS region (not shown). An n-type extension region implant is then performed to form n-type extension regions in the NMOS region.

In the above manner, the device may be fabricated with optimized PMOS transistors without any strain applied to the channel in NMOS devices. In addition, while the invention is described above with respect to the use of germanium to form a silicon germanium lattice structure, the present invention contemplates the use of any element that will create an alloy with silicon and serve to impart a compressive stress to the channel of the PMOS devices, and such alternatives are contemplated as falling within the scope of the present invention.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of forming a transistor device, comprising:
    forming a gate structure over a semiconductor body of a first conductivity type wherein the gate structure comprises a protective cap thereover and defines source/drain regions laterally adjacent thereto;
    performing a first implant of a second conductivity type into the gate structure thru the protective cap and into source/drain regions;
    etching into the semiconductor body to form recesses substantially aligned to the gate structure wherein dopant of the first implant is substantially removed from the source/drain regions;
    removing the protective cap;
    performing a second implant of the second conductivity type into the source/drain regions and the gate structure,
    forming extension regions of the second conductivity type adjacent to the gate structure, wherein performing the first implant is distinct from forming said extension regions; and
    forming sidewall spacers adjacent to the gate structure.

2. The method of claim 1, wherein forming the gate structure comprises:
    forming a gate oxide over the semiconductor body; and
    depositing and patterning a conductive layer to form a gate electrode over the gate oxide.

3. The method of claim 1, wherein the second implant is a lesser energy dose implant than the first implant dose and wherein the first implant dose is a high energy dose compared to the second implant.

4. The method of claim 1, wherein the first implant and the second implant comprise performing at least one angled implant.

5. The method of claim 1, wherein the recesses are less than about 200 angstroms in depth.

6. The method of claim 1, wherein the protective cap comprises a nitride and wherein etching into the semiconductor body to form recesses removes all of the first source/drain implant.

7. A method of forming an NMOS and a PMOS transistor concurrently, comprising:
    forming a gate structure over a semiconductor body in an NMOS region and a PMOS region, respectively wherein the gate structure comprises a protective cap thereover;
    implanting n-type extension regions in the NMOS region and p-type extension regions in the PMOS region;
    in addition to implanting n-type extension regions and p-type extensions regions, performing an implant of n-type into a source region and a drain region of the NMOS region and into the respective gate structure, and a p-type implant in a source and a drain region in the PMOS region of the semiconductor body and into the respective gate structure;
    etching into the NMOS source and drain regions and the PMOS source and drain regions of the semiconductor body to form recesses substantially aligned to the lateral edge of the respective gate structures, wherein dopant material of the n-type source and drain regions in the NMOS region and the p-type source and drain regions in the PMOS region are substantially removed therefrom; and
    performing a selective epitaxial growth in the recesses.

8. The method of claim 7, wherein performing the selective epitaxial growth comprises forming a boron doped silicon germanium in the recesses.

9. The method of claim 7, further comprising forming sidewall spacers on the lateral edges of the gate structure before etching the recesses, wherein the recesses are aligned in the semiconductor body with respect to the offset spacers.

10. The method of claim 7, wherein the implant further comprises performing at least one angled implant, wherein the angled implant results in doping contacting a top portion of the gate structure.

* * * * *